United States Patent [19]

Basile

[11] Patent Number: 4,712,020

[45] Date of Patent: Dec. 8, 1987

[54] BIAS CONTROL CIRCUIT FOR RF SWITCH

[75] Inventor: Philip C. Basile, Turnersville, N.J.

[73] Assignee: RCA Corporation, Princeton, N.J.

[21] Appl. No.: 876,984

[22] Filed: Jun. 20, 1986

[51] Int. Cl.[4] .................. H03K 17/74; H03K 19/14
[52] U.S. Cl. ................................ 307/256; 307/259; 307/311; 250/551
[58] Field of Search ............ 307/317 R, 311, 256, 307/259; 333/103, 262; 250/551

[56] References Cited

U.S. PATENT DOCUMENTS

| | | | |
|---|---|---|---|
| 4,251,742 | 2/1981 | Beelitz | 307/317 R |
| 4,369,371 | 1/1983 | Hara et al. | 250/551 |
| 4,477,817 | 10/1984 | Anderson | 343/861 |
| 4,532,433 | 7/1985 | Basile | 307/241 |

Primary Examiner—Stanley D. Miller
Assistant Examiner—B. P. Davis
Attorney, Agent, or Firm—Clement A. Berard, Jr.; William H. Meise; Christopher L. Maginniss

[57] ABSTRACT

An RF switch employing a PIN diode as the switching element includes a first bias circuit providing forward dc current through the diode to enable RF transmission therethrough, and a second bias circuit providing reverse dc voltage across the diode to disable RF transmission through the switch. Status circuitry monitors the switch for failure modes of the diode, and control circuitry selectively enables the bias circuits. A short circuit failure of the PIN diode is indicated by the flow of reverse current in the second bias circuit in excess of the diode leakage current. Under this condition, the reverse current is latched by a thyristor in the second bias circuit and the status circuitry generates an alarm signal to the control circuitry inhibiting further selection of the first bias circuit. Optical couplers provide electrical isolation of the first and second bias circuit from the control and status circuitry.

19 Claims, 2 Drawing Figures

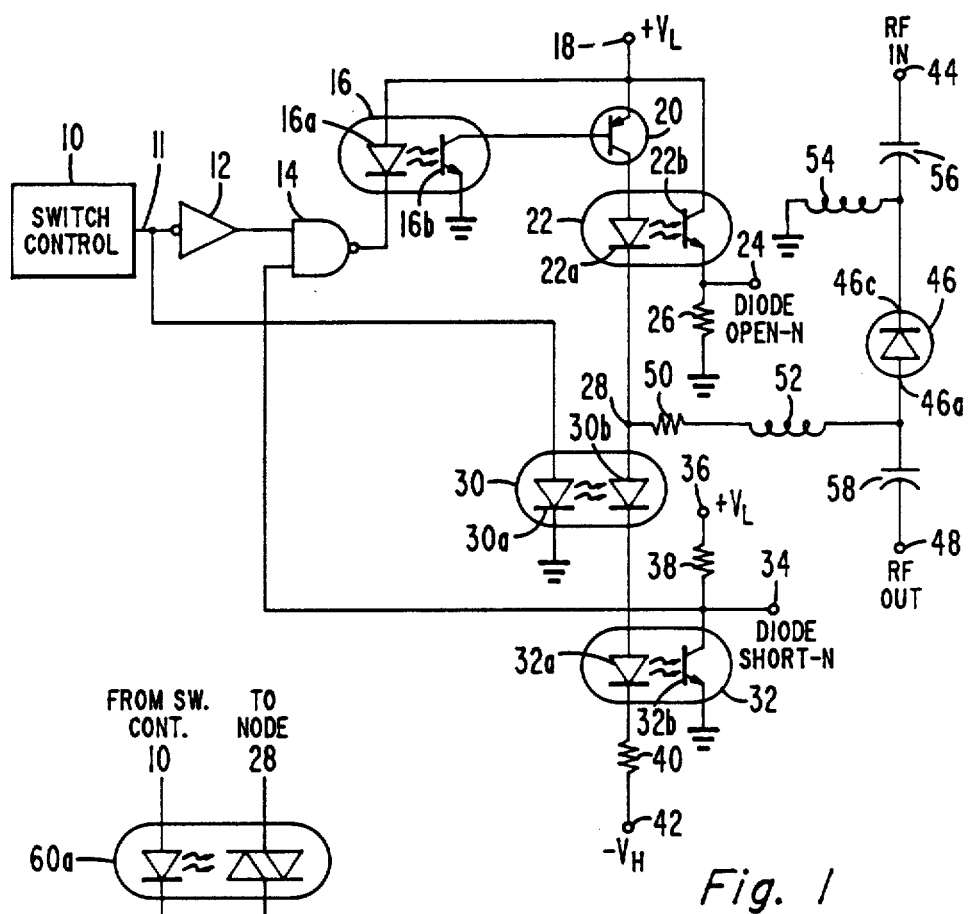
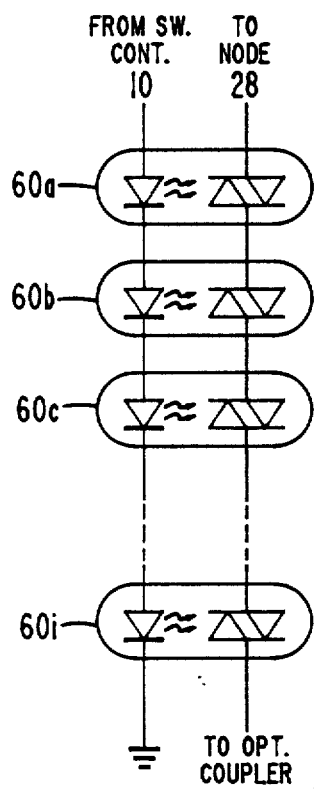
Fig. 1
Fig. 2

BIAS CONTROL CIRCUIT FOR RF SWITCH

The present invention relates generally to a switching circuit and, more particularly, to a bias control circuit for a high power RF switch including failure monitoring of the switching device.

BACKGROUND OF THE INVENTION

There are many applications where it is desirable to be able to switch an incoming signal to any one of several output terminals. One example of such a system is a shipboard high frequency (HF) radio system wherein it may be desired to convey a signal to be transmitted to a first antenna positioned in a first location or to a second antenna positioned to another location. For example, the antennas may be located at fore and aft locations on the ship. In the past, mechanical and electromechanical type switches have been used to switch a signal to a selected one of a plurality of antennas. These mechanical or electromechanical switches are subject to reliability problems and their switching speed is relatively low. Semiconductive devices provide fast and reliable operation and are therefore often employed instead.

PIN diodes are semiconductor devices which can be made to operate at relatively high radio frequencies and which function essentially as switched resistors, having a high or low resistance value depending upon the value of the biasing characteristics. These devices typically require a relatively large reverse bias voltage to present a high impedance value, and draw a substantial forward current when forward biased to present a low impedance value. In a typical HF (2-30 MHz) system, where the switch is required to transfer 1,000 watts of RF power, the optimum reverse bias voltage for the PIN diode may be −400 volts, and the optimum forward current required to maintain the diode in its low impedance state may be 150 milliamps.

When PIN diodes are employed as switching devices for applications such as those under consideration, their control can introduce problems. Care must be taken to avoid interaction between the RF signals being switched and the relatively high reverse bias voltages or large forward bias currents supplied to the diodes, and between the RF signals and the control signal which is employed to select the bias (forward or reverse) to be applied to the PIN diodes. In addition, means must be provided to ensure that a failure of a device in the bias circuitry will not couple the large bias currents and voltages into the control circuitry, with almost certain catastrophic results.

Current applications involving antenna switching, for example, communications systems which employ state of the art anti-jamming techniques such as frequency-hopping, put an even greater demand on the speed of high power RF switching. Hopping rates of 2 KHz permit a dwell time at each frequency of only 500 microseconds, and it is a reasonable constraint in such a system that a maximum of ten percent of that dwell time be allotted for switching transients and settling. The PIN diodes themselves can switch relatively quickly, in much less than 50 microseconds. Therefore, the bias circuits must be designed to provide switching times compatible with the switching application. Conventional bias circuitry, using a single switching transistor with a current-limiting load resistor cannot achieve fast bias switching, due to the time required to charge or discharge the stray capacitances to a high voltage through a relatively large resistance.

SUMMARY OF THE INVENTION

In accordance with the principles of the present invention, there is disclosed an apparatus for controlling a switching diode by the selective application of forward bias current and reverse bias voltage thereto. The apparatus comprises a first bias circuit for coupling forward current to the diode and a second bias circuit for applying reverse voltage to the diode. The reverse voltage produces a small leakage current flow through the diode, and the second bias circuit includes means responsive to reverse current flow through the second bias circuit which is substantially greater than the leakage current for latching the reverse current therethrough. A first means is provided which is responsive to the reverse current flow through the second bias circuit for generating a diode alarm signal. Finally, the apparatus includes means for selectively enabling the first and second bias circuits, wherein the diode alarm signal is coupled to the enabling means for disabling the first bias circuit.

BRIEF DESCRIPTION OF THE DRAWINGS

FIG. 1 is a schematic representation of the preferred embodiment of the present invention; and FIG. 2 illustrates a modification of the bias control circuit for use with higher voltage RF signals.

DETAILED DESCRIPTION OF THE PREFERRED EMBODIMENT

Referring to FIG. 1, there is shown a bias control circuit according to the present invention for selectively providing forward bias current and reverse bias voltage to switching diode 46 for respectively enabling and disabling RF signals therethrough. In the present example, diode 46 is a PIN diode, whose switching characteristics are well known and which have been briefly described in an earlier paragraph.

PIN diode 46 will pass RF signals with virtually no resistance between RF input terminal 44 and RF output terminal 48 when a forward dc bias current flows through diode 46, that is, from its anode 46a to its cathode 46c. Furthermore, PIN diode 46 will exhibit a very high resistance, effectively blocking RF signal transmission between terminals 44 and 48, when the dc voltage level at anode 46a is sufficiently negative with respect to the voltage level at cathode 46c. The reverse bias voltage across diode 46 must be roughly equivalent to the peak RF voltage excursion for effective blockage.

The dc path through PIN diode 46 includes current-limiting resistor 50, inductors 52 and 54 and diode 46. For the parameter values to be used in the present example, resistor 50 may have a value of 20 ohms. Inductor 54 is coupled at one end to ground potential, thereby providing a sink for the forward dc bias current through diode 46 and a reference potential for the reverse dc bias voltage. Inductors 52 and 54 effectively block the RF signals from the dc path while passing the dc signals with virtually no impedance.

The RF path between terminals 44 and 48 includes PIN diode 46 and blocking capacitors 56 and 58. Capacitor 56 effectively blocks the dc signals from the RF circuits (not shown) coupled at terminal 44, and capacitor 58 effectively blocks the dc signals from the RF circuits (not shown) coupled at terminal 48, while both capacitors 56 and 58 pass the RF signals with virtually no impedance.

The control circuitry of the FIG. 1 embodiment includes switch control 10, inverter 12 and gate 14, and is responsive to a diode alarm signal generated by phototransistor 32b and resistor 38 in the status circuitry. Inverter 12 and gate 14 may typically be chosen from the 7400 series of TTL digital logic elements, and switch control 10 may be a process controller, such as a microprocessor, which generates a TTL-compatible signal on lead 11. In the present example, switch control 10 generates a logic low signal, typically 0 volts, to produce forward biasing of PIN diode 46 so as to conduct RF signals, and generates a logic high signal, typically +5 volts, to produce reverse biasing of PIN diode 46 so as to block RF signals.

The status circuitry of the FIG. 1 embodiment includes resistors 26 and 38 and part of optical couplers 22 and 32. Optical couplers 22 and 32 may be of a type similar to type 4N33, sold by Motorola Semiconductor Products, Inc., Phoenix, Ariz. When current flows through light-emitting diode (LED) 22a, it emits light which is optically coupled to photosensitive transistor 22b, which saturates in the presence of the detected light. This has the effect of applying a voltage of nearly $+V_L$, typically +5 volts, across resistor 26, producing the equivalent of a logic high level at status terminal 24. When no current flows through LED 22a, phototransistor 22b is fully off, and terminal 24 sees a virtual ground, which is the equivalent of a logic low level. In the present example, resistor 26 is typically 1 kilohm to be compatible with TTL logic.

When current flows through LED 32a, it emits light which is optically coupled to phototransistor 32b, which saturates in the presence of the detected light. This has the effect of dropping the full voltage $+V_L$ applied at terminal 36, typically +5 volts, across resistor 38, resulting in a virtual ground at status terminal 34, producing the equivalent of a logic low level. When no current flows through LED 32a, phototransistor 32b is fully off, and terminal 34 sees essentially the entire $+V_L$, which is the equivalent of a logic high level. In the present example, resistor 38 is typically 1 kilohm.

A first bias circuit provides forward dc bias current to PIN diode 46, and includes optical coupler 16, transistor 20 and optical coupler 22. Optical coupler 16, which may be of a type similar to optical couplers 22 and 32, includes LED 16a optically coupled to phototransistor 16b, such that when light is emitted from LED 16a, phototransistor 16b saturates and its collector is pulled down close to the ground potential at its emitter. In the present example, transistor 20 is a high-voltage, PNP bipolar device, which may be of a type similar to type MJ4647, sold by Motorola Semiconductor Products, Inc., operated between full-off and full-on, and capable of switching at least 150 milliamps across its emitter-collector junction. The collector-emitter junction of transistor 20 must be capable of withstanding a potential in excess of the large negative voltage applied at power input terminal 42 which, in the present example, is typically −400 volts.

A first voltage source (not shown) couples a small positive potential $+V_L$, typically +5 volts, to power input terminal 18. With the potential at the cathode of LED 16a at zero volts, current passes through LED 16a causing it emit light onto phototransistor 16b which saturates, and transistor 20 is driven into full conduction, enabling current flow through optical coupler 22 to node 28, from which it flows through PIN diode 46.

A second bias circuit provides reverse dc bias voltage to PIN diode 46, and includes optical thyristor 30, optical coupler 32 and resistor 40. Optical thyristor 30 includes LED 30a optically coupled to photosensitive thyristor 30b, such that when light is emitted by LED 30a, photothyristor 30b provides electrical conductivity. Resistor 40 functions as a current limiter for the short-circuit failure mode of PIN diode 46, and may typically have a resistance value of 100 kilohms.

Element 30b has been described thus far as a thyristor, which is a generic term for the family of controllable bistable semiconductor switching devices having self-latching capability in the presence of current flow therethrough. Another such device is a silicon controlled rectifier. In the actual implementation of the invention, however, device 30 may preferably be an optical triac, of a type similar to type MOC3021, sold by, for example, Motorola Semiconductor Products, Inc., as it is the only such currently-available semiconductor switching device with self-latching capability in an optical configuration capable of withstanding the high potential required to reverse bias PIN diode 46.

A second voltage source (not shown) couples a large negative potential $-V_H$, typically −400 volts, to power input terminal 42. With the potential at the anode of LED 30a at some positive level, illustratively +5 volts, current passes through LED 30a, causing it to emit light which is coupled to photothyristor 30b, thereby enabling an electrical path between node 28 and power input terminal 42. Thus, the large negative voltage coupled at power input terminal 42 may be selectively applied across PIN diode 46 as a reverse bias.

With an effectively open circuit from ground to node 28 through diode 46, there is virtually no current passing through LED 32a and photothyristor 30b. The only current flowing through these devices is the diode leakage current, which is of the order of 10 nanoamps. This is not a sufficient amount of current to cause light emission from LED 32a. Thus, phototransistor 32b does not turn on, and a high level logic signal is coupled back to one input terminal of AND gate 14 in the control circuitry for enabling selection of the first bias circuit.

The leakage current flow through photothyristor 30b is also insufficient to latch that device when LED 30a is extinguished. Therefore, repetitive forward and reverse biasing of PIN diode 46 can be achieved. If, however, PIN diode 46 should fail in the short circuit mode, significantly greater current (approximately four milliamps) would flow through photothyristor 30b, latching that device on until the current flow is interrupted by disablement of the power applied to terminal 42 or replacement of the faulty PIN diode 46.

Summarizing the responses of the first and second bias circuits to the output signals from switch control 10, and their effects on PIN diode 46 and the status circuitry, it is seen that when the signal on lead 11 is a logic low, dc current is enabled from terminal 18, through node 28 and PIN diode 46 to ground. In this circumstance, the logic level at status terminal 24 is high, and thus the DIODE OPEN-N signal is false. Should diode 46 fail in an open circuit mode, there would be no current flow through the first bias circuit and the logc level at terminal 24 would be a low, and thus the DIODE OPEN-N signal would be true.

When the signal on lead 11 is a logic high, a dc electrical path is completed between terminal 42 and PIN diode 46 and, because diode 46 appears as a virtual open circuit to the polarity of the voltage applied at terminal 42, virtually no current flows through the second circuit. In this circumstance, the logic level at status terminal 34 is high, and thus the DIODE SHORT-N signal is false. Should diode 46 fail in a short circuit mode, there would be substantial current flow through the second bias circuit, which current flow would be latched by photothyristor 30b, the logic level at terminal 34 would be a low, and thus the DIODE SHORT-N signal would be true. It will be recalled that when a short circuit failure of PIN diode 46 is detected, the logic low alarm status signal appearing at terminal 34 is also coupled back into the control circuitry at gate 14 to inhibit subsequent selection of forward dc current flow through diode 46 via the first bias circuit.

It will be noticed that the elements in the bias paths, between terminals 18 and 42, are all electrically isolated from the elements of the control and status circuitry. In particular, optical coupler 16 provides electrical isolation between LED 16a in the control circuitry and phototransistor 16b in the first bias circuit. Optical coupler 22 provides electrical isolation between LED 22a in the first bias circuit and phototransistor 22b in the status circuitry. Optical thyristor 30 provides electrical isolation between LED 30a in the control circuitry and photothyristor 30b in the second bias circuit. Finally, optical coupler 32 provides electrical isolation between LED 32a in the second bias circuit and phototransistor 32b in the status circuitry.

It will further be noticed that the RF switch of the present invention depicted in FIG. 1 provides very fast switching times, as none of the elements in the switching paths injects any significant delay. The logic elements of the control circuitry operate at nanosecond rates. In the first bias circuit, transistor 20 can switch between full-off and full-on within a few microseconds. The limiting factor to the switching speed of the RF switch lies in the second bias circuit, which charges diode 46 to −400 volts. However, unlike conventional bias circuitry, in which the stray capacitances of the circuit elements charge slowly through relatively high resistance, the path between photothyristor 30b and diode 46 is of very low resistance, typically 20 ohms, as noted earlier. Thus, switching times of 50 microseconds may be achieved by the RF switch of the present invention.

Referring now to FIG. 2, there is shown a cascade arrangement of optical triacs 60a, 60b, . . ., 60i, referred to collectively as optical triacs 60, which may be used in place of the single optical thyristor 30 of the FIG. 1 embodiment, for extremely high voltage RF applications. If each single optical triac 60 is capable of withstanding a reverse bias voltage in excess of 400 volts, then by cascading, for example, twenty-five optical triacs 60, in the manner shown in FIG. 2, an off bias voltage in excess of 10,000 volts can be maintained across PIN diode 46 when it is required to switch extremely high voltage RF signals between input terminal 44 and output terminal 48. It should be recognized, however, that transistor 20 must also withstand the reverse voltage applied at terminal 42, and that a higher-voltage transistor or an alternative arrangement of first bias circuit current driver, not disclosed herein, would be necessitated.

While the principles of the present invention have been demonstrated with particular regard to the illustrated structure of the figures, it will be recognized that various departures from such illustrative structure may be undertaken in the practice of the invention. The scope of this invention is therefore not intended to be limited to the structure disclosed herein but should instead be gauged by the breadth of the claims which follow.

What is claimed is:

1. An apparatus for controlling a switching diode by the selective application of forward bias current and reverse bias voltage thereto, said reverse bias voltage being of such a magnitude as to cause a reverse leakage current through said diode which has a magnitude less than a predetermined magnitude when said diode is in a normal operating condition, and to cause a reverse leakage current through said diode which has a magnitude substantially greater than said predetermined magnitude when said diode is in a shorted condition said apparatus comprising:

a first bias circuit for coupling forward current to said diode;

a second bias circuit for applying reverse voltage to said diode, said reverse voltage producing said reverse leakage current flow through said diode, said second bias circuit including means responsive to said reverse leakage current flow through said second bias circuit which has a magnitude substantially greater than said predetermined magnitude for latching said reverse leakage current therethrough;

first generating means responsive to said reverse leakage current flow through said second bias circuit for generating a diode alarm signal; and means for selectively enabling said first and second bias circuits, said diode alarm signal being coupled to said enabling means for disabling said first bias circuit.

2. An apparatus for controlling a switching diode by the selective application of forward bias current and reverse bias voltage thereto, said reverse bias voltage being of such a magnitude as to cause a reverse leakage current through said diode which has a magnitude less than a predetermined magnitude when said diode is in a normal operating condition, and to cause a reverse leakage current through said diode which has a magnitude substantially greater than said predetermined magnitude when said diode is ina shorted condition, said apparatus comprising:

a first bias circuit for coupling forward current to said diode;

a second bias circuit for applying reverse voltage to said diode, said reverse producing said reverse leakage current flow through said diode, said second bias circuit including means responsive to said reverse leakage current flow through said second bias circuit which has a magnitude substantially greater than said predetermined magnitude for latching said reverse leakage current therethrough;

first generating means responsive to said reverse leakage current flow through said second bias circuit for generating a diode alarm signal; and means for selectively enabling said first and second bias circuits, said diode alarm signal being coupled to said enabling means for disabling said first bias circuit; and status signal generating means responsive to the absence of forward current flow through said first bias circuit for generating a diode status signal.

3. The apparatus according to claim 2 wherein said first bias circuit is electrically isolated from said status signal generating means and said enabling means and wherein said second bias circuit is electrically isolated from said first generating means and said enabling means.

4. An apparatus for controlling a switching diode by the selective application of forward bias current and reverse bias voltage thereto, said reverse bias voltage being of such a magnitude as to cause a reverse leakage current through said diode which has a magnitude less than a predetermined magnitude when said diode is in a normal operating condition, and to cause a reverse leakage current through said diode which has a magnitude substantially greater than said predetermined magnitude When said diode is in a shorted condition, said apparatus comprising:
   a first bias circuit for coupling forward current to said diode;
   a second bias circuit for supplying reverse voltage to said diode, said reverse voltage producing said reverse leakage current flow through said diode, said second bias circuit including means responsive to said reverse leakage current flow through said second bias circuit which has a magnitude substantially greater than said predetermined magnitude for latching said reverse leakage current therethrough;
   first generating means responsive to said reverse leakage current flow through said second bias circuit for generating a diode alarm signal; and
   means for selectively enabling said first and second bias circuits, said diode alarm signal being coupled to said enabling means for disabling said first bias circuit; and further including
   second generating means responsive to the absence of forward current flow though said first bias circuit for generating a diode status signal;
   said first bias circuit being electrically isolated from said enabling means by a first optical coupler for coupling said enabling means to said first bias circuit;
   said first bias circuit being electrically isolated from said second generating means by a second optical coupler for coupling said first bias circuit to said second generating means;
   said second bias circuit being electrically isolated from said first generating means by a third optical coupler for coupling said second bias circuit to said first generating means; and
   said second bias circuit being electrically isolated from said enabling means by a fourth optical coupler for coupling said enabling means to said second bias circuit.

5. The apparatus according to claim 4 wherein said first, second and third optical couplers each comprises a light emitting diode optically coupled to a phototransistor.

6. The apparatus according to claim 4 wherein said fourth optical coupler comprises a light emitting diode optically coupled to an optical thyristor.

7. The apparatus according to claim 4 wherein said fourth optical coupler comprises a plurality of light emitting diodes connected in cascade between said enabling means and a reference potential, said plurality of light emitting diodes being optically coupled, respectively, to a corresponding plurality of optical triacs, said plurality of optical triacs being connected in cascade within said second bias circuit.

8. A radio frequency (RF) switch comprising:
   a diode responsive to forward dc current flow therethrough for enabling an RF signal across said diode, and responsive to a reverse dc voltage for blocking an RF signal, said reverse dc voltage being of such a magnitude as to cause a reverse leakage current through said diode which has a magnitude less than a predetermined magnitude when said diode is in a operating condition, and to cause a reverse leakage current through said diode which has a magnitude substantially greater than said predetermined magnitude when said diode is in a shorted condition;
   a first bias circuit for coupling forward dc current to said diode;
   a second bias circuit for applying reverse dc voltage to said diode, said reverse voltage producing said reverse leakage current flow through the diode, said second bias circuit including means responsive to said reverse leakage current flow through said second bias circuit which has a magnitude substantially greater than said predetermined magnitude for latching said reverse leakage current therethrough;
   first generating means responsive to said reverse leakage current flow through said second bias circuit for generating a diode alarm signal; and
   enabling means for selectively enabling said first and second bias circuits, said diode alarm signal being coupled to said enabling means for disabling said first bias circuit.

9. A radio frequency (RF) switch comprising:
   a diode responsive to forward dc current flow therethrough for enabling an RF signal across said diode, and responsive to a reverse dc voltage for blocking an RF signal, said reverse dc voltage being of such a magnitude as to cause a reverse leakage current through said diode which has a magnitude less than a predetermined magnitude when said diode is in a normal operating condition, and to cause a reverse leakage current through said diode which has a magnitude substantially greater than said predetermined magnitude when said diode is in a shorted condition;
   a first bias circuit for coupling forward dc current to said diode;
   a second bias circuit for applying reverse dc voltage to said diode, said reverse voltage producing said reverse leakage current flow through the diode, said second bias circuit including means responsive to said reverse leakage current flow through said second bias circuit which has a magnitude substantially greater than said predetermined magnitude for latching said reverse leakage current therethrough;
   first generating means responsive to said reverse leakage current flow through said second bias circuit for generating a diode alarm signal; and
   enabling means for selectively enabling said first and second bias circuits, said diode alarm signal being coupled to said enabling means for disabling said first bias circuit; and
   further including second means responsive to the absense of forward current flow through said first bias circuit for generating a diode status signal.

10. The RF switch according to claim 9 wherein said first bias circuit is electrically isolated from said second generating means and said enabling means and wherein said second bias circuit is electrically isolated from said first generating means and said enabling means.

11. A radio frequency (RF) switch comprising:
a diode responsive to forward dc current flow therethrough for enabling an RF signal across said diode, and responsive to a reverse dc voltage for blocking an RF signal, said reverse dc voltage being of such a magnitude as to cause a reverse leakage current through said diode which has a magnitude less than a predetermined magnitude when said diode is in a normal operating condition, and to cause a reverse leakage current through said diode which has a magnitude substantially greater than said predetermined magnitude when said diode is in a shorted condition;
a first bias circuit for coupling forward dc current to said diode;
a second bias curcuit for applying reverse dc voltage to said diode, said reverse voltage producing said reverse leakage current flow through the diode, said second bias circuit including means responsive to said reverse leakage current flow through said second bias circuit which has a magnitude substantially greater than said predetermined magnitude for latching said reverse leakage current therethrough;
first generating means responsive to said reverse leakage current flow through said second bias circuit for generating a diode alarm signal; and
enabling means for selectively enabling said first and second bias circuits, said diode alarm signal being coupled to said enabling means for disabling said first bias circuit further including
second generating means responsive to the absence of forward current flow through said first bias circuit for generating a diode status signal; and wherein
said first bias circuit is electrically isolated from said enabling means by a first optical coupler for coupling said enabling means to said first bias circuit;
said second generating means is electrically isolated from said first bias circuit by a second optical coupler for coupling said first bias circuit to said second generating means;
said first generating means is electrically isolated from said second bias circuit by a third optical coupler for coupling said second bias circuit to said first generating means; and
said second bias circuit is electrically isolated from said enabling means by a fourth optical coupler for coupling said enabling means to said second bias circuit.

12. The RF switch according to claim 11 wherein said first, second and third optical couplers each comprises a light emitting diode optically coupled to a phototransistor.

13. The RF switch according to claim 11 wherein said fourth optical coupler comprises a light emitting diode optically coupled to an optical thyristor.

14. The RF switch according to claim 11 wherein said fourth optical coupler comprises a plurality of light emitting diodes connected in cascade between said enabling means and a reference potential, said plurality of light emitting diodes being optically coupled, respectively, to a corresponding plurality of optical triacs, said plurality of optical triacs being connected in cascade within said second bias circuit.

15. The RF switch according to claim 8 wherein said diode comprises a PIN diode.

16. The RF switch according to claim 15 further including a dc path for coupling said forward dc current of said first bias circuit and said reverse dc voltage of said second bias circuit through said diode to a reference potential.

17. The RF switch according to claim 16 wherein said dc path includes an inductance.

18. The RF switch according to claim 8 further including a capacitance for isolating said forward dc current and said reverse dc voltage from said RF signal.

19. The apparatus according to claim 3 further including:
a first optical coupler for coupling said enabling means to said first bias circuit;
a second optical coupler for coupling said first bias circuit to said status signal generating means;
a third optical coupler for coupling said second bias circuit to said first generating means; and
a fourth optical coupler for coupling said enabling means to said second bias circuit.

* * * * *

UNITED STATES PATENT AND TRADEMARK OFFICE
CERTIFICATE OF CORRECTION

PATENT NO. : 4,712,020

DATED : December 8, 1987

INVENTOR(S) : Philip Charles Basile

It is certified that error appears in the above-identified patent and that said Letters Patent is hereby corrected as shown below:

Column 6, line 47, "ina" should be --in a--.

Column 6, line 52, insert "voltage" after "reverse" (first occurrence).

Column 7, line 16, "When" should be --when--.

Column 7, line 20, "supplying" should be --applying--.

Signed and Sealed this

Seventh Day of June, 1988

Attest:

DONALD J. QUIGG

Attesting Officer

Commissioner of Patents and Trademarks